(12) United States Patent
Kadow

(10) Patent No.: US 10,522,675 B2
(45) Date of Patent: Dec. 31, 2019

(54) INTEGRATED CIRCUIT INCLUDING FIELD EFFECT TRANSISTOR STRUCTURES WITH GATE AND FIELD ELECTRODES AND METHODS FOR MANUFACTURING AND OPERATING AN INTEGRATED CIRCUIT

(75) Inventor: Christoph Kadow, Gauting (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/358,272

(22) Filed: Jan. 25, 2012

(65) Prior Publication Data

US 2013/0187196 A1   Jul. 25, 2013

(51) Int. Cl.

| | | |
|---|---|---|
| H01L 29/66 | (2006.01) |
| H01L 29/739 | (2006.01) |
| H01L 21/02 | (2006.01) |
| H01L 27/088 | (2006.01) |
| H01L 29/78 | (2006.01) |

(Continued)

(52) U.S. Cl.
CPC .. *H01L 29/7813* (2013.01); *H01L 21/823487* (2013.01); *H01L 27/088* (2013.01); *H01L 29/7397* (2013.01); *H01L 29/7803* (2013.01); *H01L 29/0615* (2013.01);
(Continued)

(58) Field of Classification Search
CPC ............. H01L 29/7395; H01L 29/7803; H01L 23/5389; H01L 2924/13055; H01L 2924/14–2924/14335; H01L 29/66666; H01L 29/66712–29/66734; H01L 29/7802–29/7815; H01L 29/7827–29/7828; H01L 27/085–27/098; H01L 27/088; H01L 27/09; H01L 29/78642; H01L 29/78132; H01L 21/336; H01L 21/823487; H01L 21/8238; H01L 21/8232–21/8239; H01L 29/7397; H01L 29/803; H01L 29/7813; H01L 29/42368;
(Continued)

(56) References Cited

U.S. PATENT DOCUMENTS 3,778,688 A * 12/1973 Crawford ...................... 345/206
5,023,693 A *  6/1991 Mori et al. .................... 257/563
(Continued)

FOREIGN PATENT DOCUMENTS

| CN | 101364613 A | 2/2009 |
| DE | 10211543 A1 | 10/2003 |

(Continued)

OTHER PUBLICATIONS

B. Desoete et al., "Integrated Submicron Switching Transistor Breaking the Si Limit at 100V", On Semiconductor, Belgium.
(Continued)

*Primary Examiner* — Natalia A Gondarenko
(74) *Attorney, Agent, or Firm* — Murphy, Bilak & Homiller, PLLC

(57) ABSTRACT

An integrated circuit includes a first and a second field effect transistor structure. The first field effect transistor structure includes a first gate electrode structure and a first field electrode structure. The second field effect transistor structure includes a second gate electrode structure and a second field electrode structure. The first and the second gate electrode structures are electrically separated from each other. The first and the second field electrode structures are separated from each other.

19 Claims, 8 Drawing Sheets

(51) Int. Cl.
  *H01L 21/8234* (2006.01)
  *H01L 29/40* (2006.01)
  *H01L 29/423* (2006.01)
  *H01L 29/06* (2006.01)
  *H01L 29/10* (2006.01)

(52) U.S. Cl.
  CPC ...... *H01L 29/0653* (2013.01); *H01L 29/1095* (2013.01); *H01L 29/407* (2013.01); *H01L 29/42368* (2013.01)

(58) Field of Classification Search
  CPC ............. H01L 29/0615; H01L 29/1095; H01L 29/407; H01L 29/0653
  USPC .... 257/140, 337, 341, E27.06, E29.197, 334
  See application file for complete search history.

(56) References Cited

U.S. PATENT DOCUMENTS

| | | | |
|---|---|---|---|
| 5,126,911 A | 6/1992 | Contiero et al. | |
| 5,998,833 A | 12/1999 | Baliga | |
| 7,638,841 B2* | 12/2009 | Challa | 257/341 |
| 7,911,750 B2* | 3/2011 | Zhan et al. | 361/56 |
| 2003/0173619 A1 | 9/2003 | Feldtkeller et al. | |
| 2006/0157779 A1* | 7/2006 | Kachi et al. | 257/330 |
| 2007/0120150 A1* | 5/2007 | Meyer et al. | 257/213 |
| 2007/0296029 A1 | 12/2007 | Hirler et al. | |
| 2008/0116511 A1* | 5/2008 | Zundel et al. | 257/330 |
| 2009/0051405 A1 | 2/2009 | Kadow et al. | |
| 2009/0189461 A1* | 7/2009 | Dibra | H01L 27/088 307/131 |
| 2010/0102871 A1 | 4/2010 | Werner | |
| 2010/0140695 A1* | 6/2010 | Yedinak et al. | 257/334 |
| 2010/0213506 A1* | 8/2010 | Willmeroth et al. | 257/140 |
| 2010/0213910 A1* | 8/2010 | Chen | 323/282 |
| 2010/0276752 A1* | 11/2010 | Hebert | H01L 21/823885 257/338 |
| 2010/0308872 A1* | 12/2010 | Gillberg | H01L 21/823487 327/108 |
| 2011/0101940 A1* | 5/2011 | Kudo | H02M 3/1584 323/282 |
| 2011/0136310 A1* | 6/2011 | Grivna | H01L 29/407 438/270 |
| 2011/0241170 A1 | 10/2011 | Haeberlen et al. | |
| 2012/0086416 A1* | 4/2012 | Kudo et al. | 323/265 |

FOREIGN PATENT DOCUMENTS

| | | |
|---|---|---|
| DE | 102006026943 B4 | 12/2007 |
| DE | 102008058013 A1 | 5/2009 |
| DE | 102008044411 A1 | 8/2009 |
| DE | 102009047786 A1 | 1/2012 |

OTHER PUBLICATIONS

M. Tack and P. Moens, "Smart Power SoC Challenges and Solutions to integrate Power Drivers in advanced CMOS technologies", Smart Power Centre of Excellence, On Semiconductor, Belgium.

\* cited by examiner

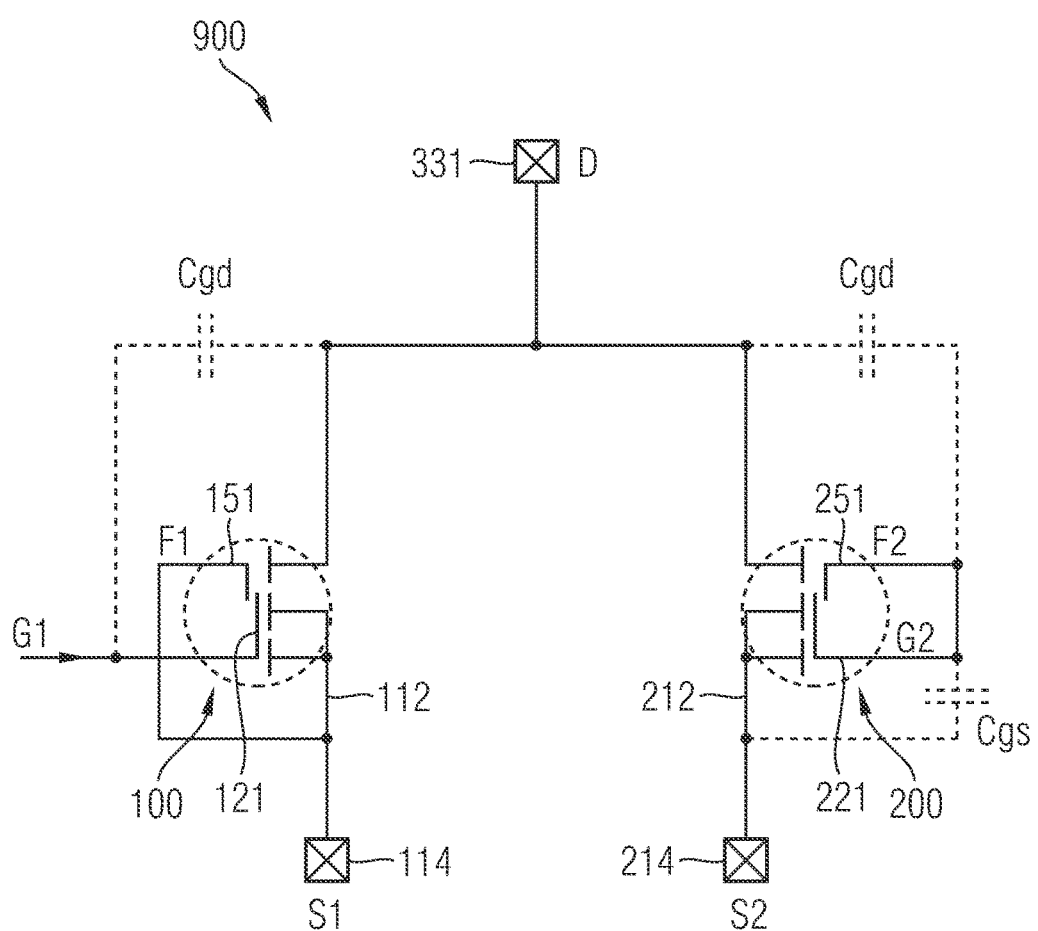

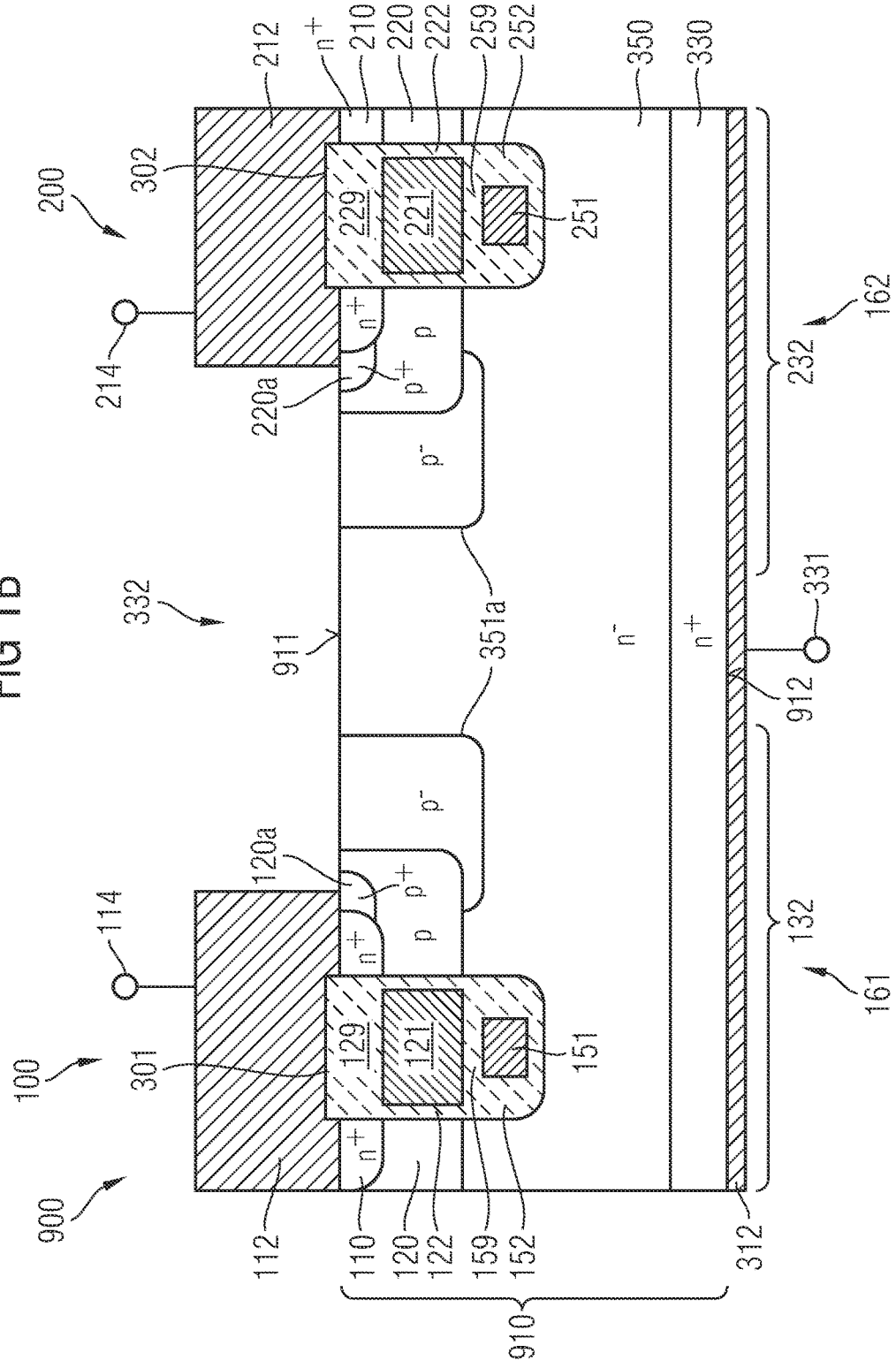

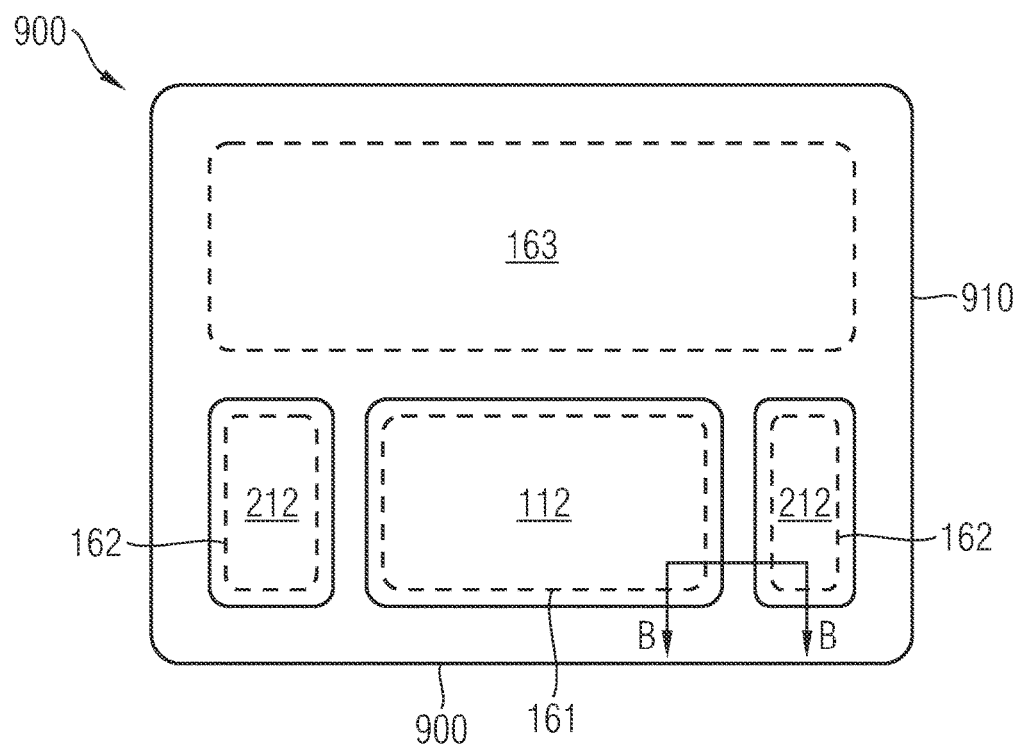

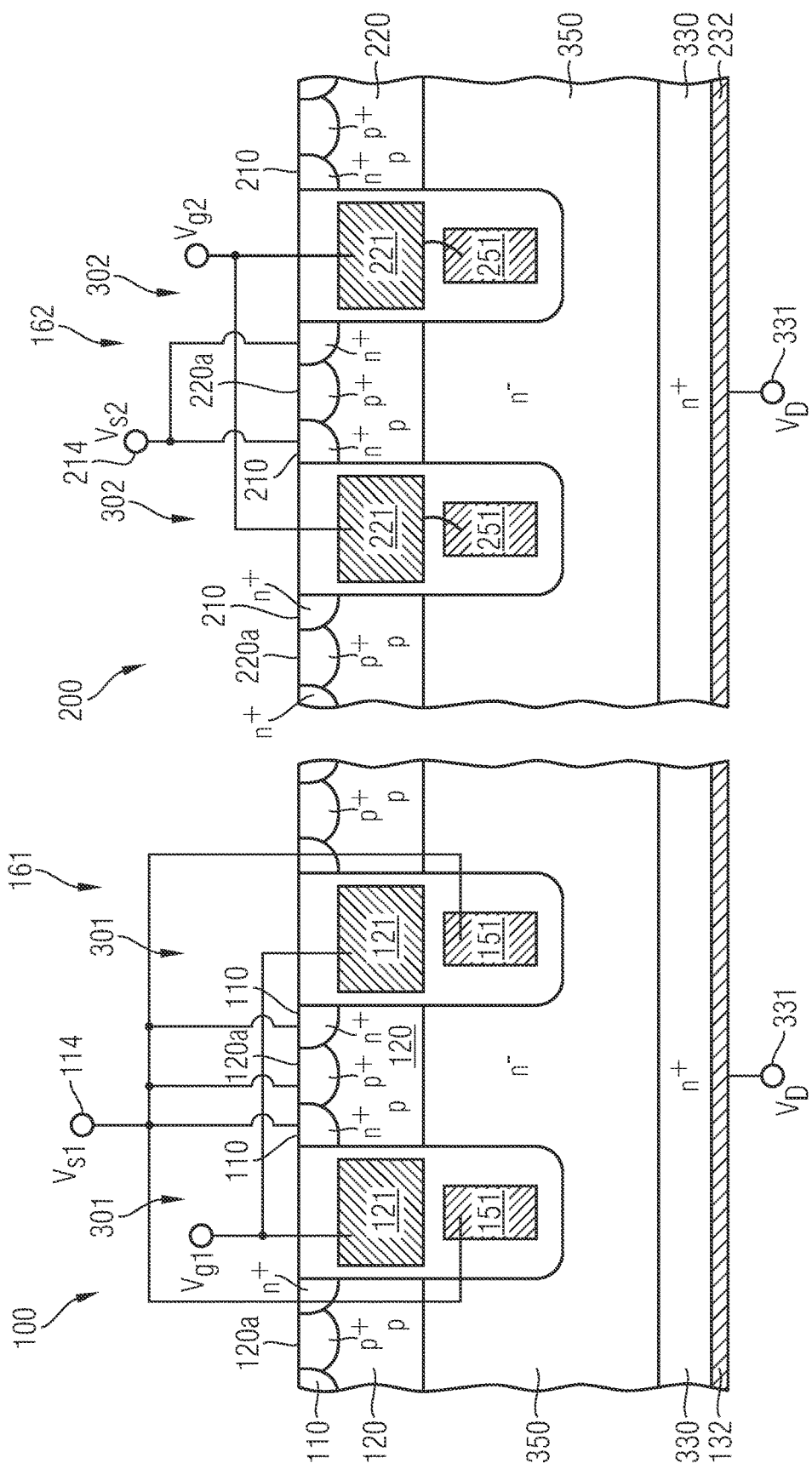

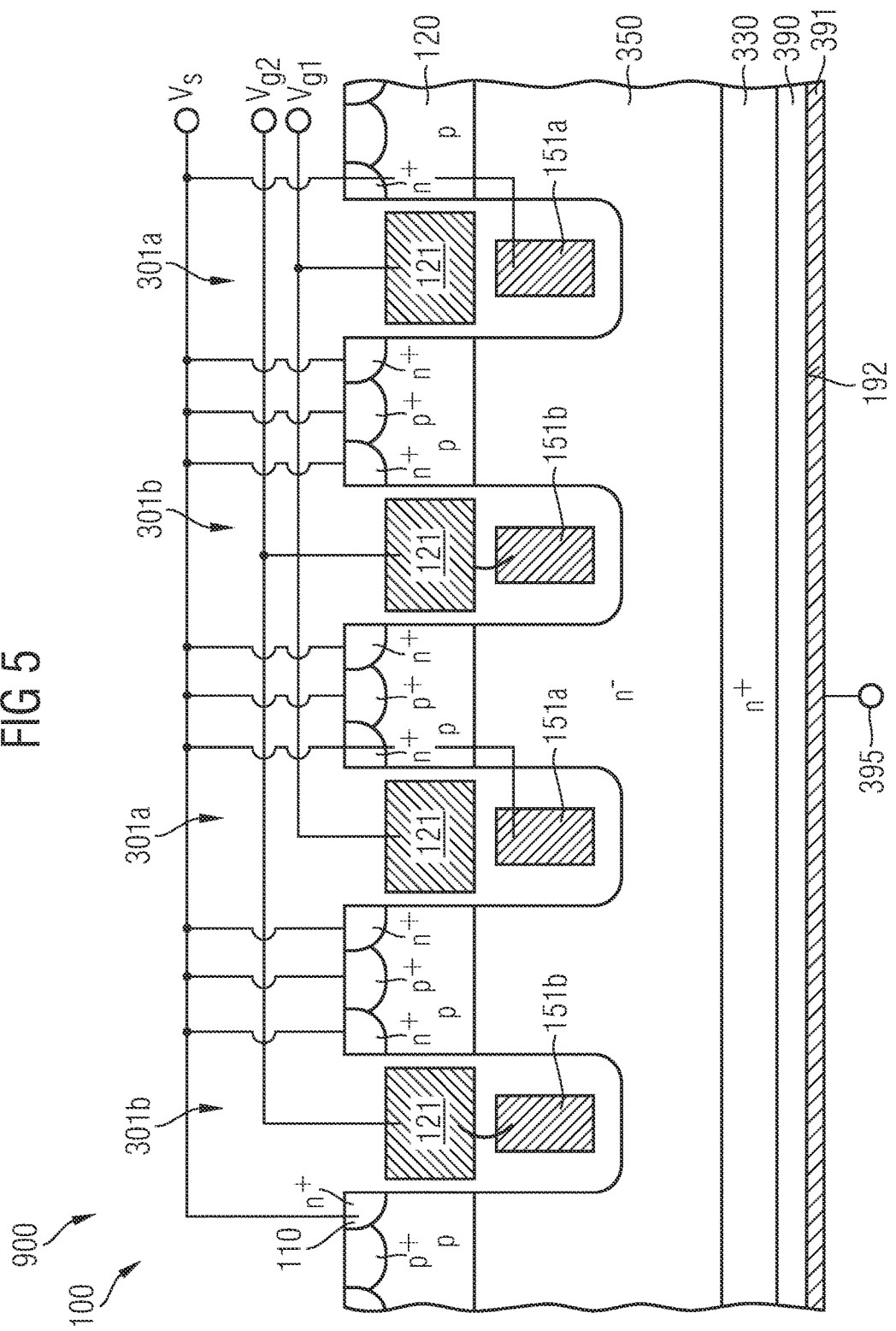

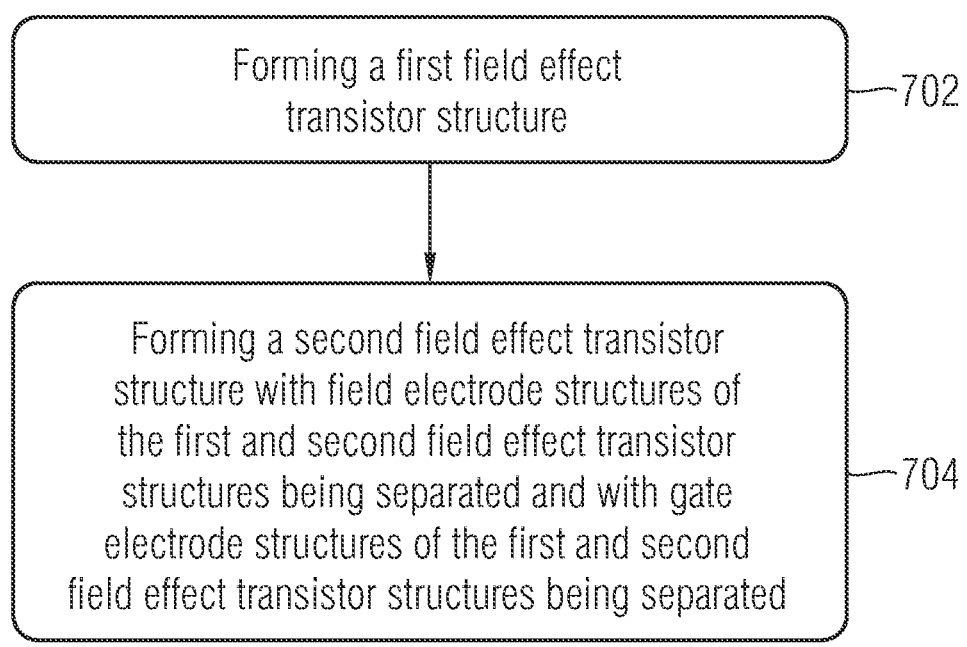

INTEGRATED CIRCUIT INCLUDING FIELD EFFECT TRANSISTOR STRUCTURES WITH GATE AND FIELD ELECTRODES AND METHODS FOR MANUFACTURING AND OPERATING AN INTEGRATED CIRCUIT

BACKGROUND

Integrated circuits including a power transistor for switching an external load may include a field electrode, which is capacitively coupled to a drift zone of the power transistor. The field electrode may be electrically connected to source regions of the power transistor for achieving a low gate-to-drain capacity Cgd. On the other hand, power transistors are prone to fast transient voltage pulses which may result in a malfunction of the integrated circuit.

It is desirable to improve switching characteristics and resistance against transient voltage pulses at the terminals of integrated circuits.

SUMMARY

According to an embodiment an integrated circuit includes a first and a second field effect transistor structure. The first field effect transistor structure includes a first gate electrode structure and a first field electrode structure. The second field effect transistor structure includes a second gate electrode structure and a second field electrode structure. The first and the second gate electrode structures are electrically separated from each other.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts.

FIG. 1A is a schematic circuit diagram of an integrated circuit with a first and a second field effect transistor structure according to an embodiment.

FIG. 1B is a schematic cross-sectional view of a portion of an integrated circuit with a first and a second field effect transistor structure in accordance with an embodiment providing separation of active areas by pn-junctions.

FIG. 2A is a schematic plan view of an integrated circuit including a first active area with a first field effect transistor structure and two active areas with second field effect transistor structures.

FIG. 4 is a schematic cross-sectional view of a portion of an integrated circuit in accordance with an embodiment providing separated source electrodes.

FIG. 5 is a schematic cross-sectional view of a portion of an integrated circuit comprising a plurality of first field effect transistor structures in accordance with an embodiment.

FIG. 6 is a simplified flowchart for illustrating a method of manufacturing an integrated circuit with a first and a second field effect transistor structure in accordance with a further embodiment.

DETAILED DESCRIPTION

Figure 2B:
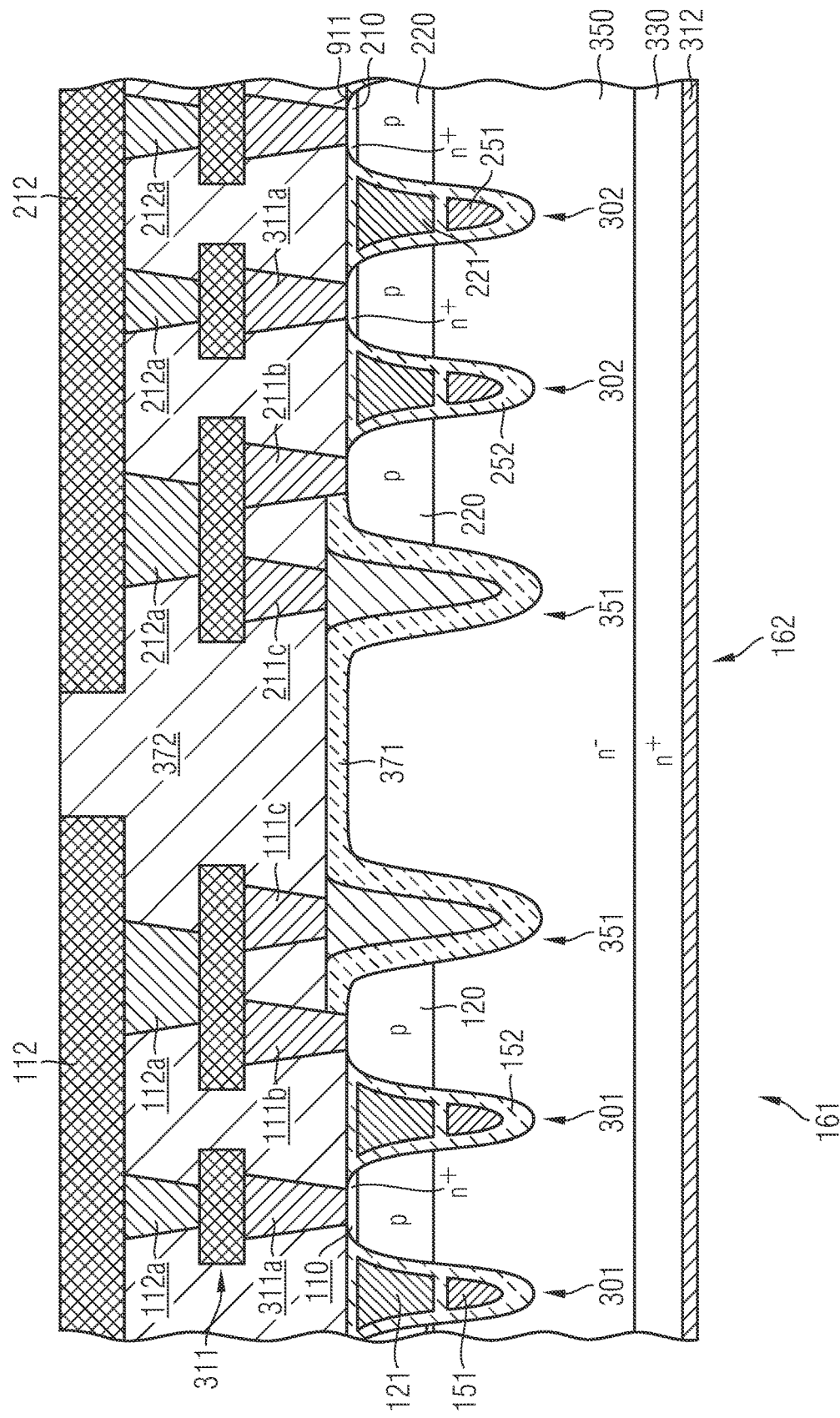
FIG. 2B is a schematic cross-sectional view of a portion of an integrated circuit with a first and a second field effect transistor structure in accordance with an embodiment providing trench structures for separating active areas.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described as part of one embodiment can be used in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes are designated by the same references in the different drawings if not stated otherwise.

As employed in the specification, the term "electrically coupled" is not meant to mean that the elements must be directly coupled together. Instead, intervening elements may be provided between the "electrically coupled" elements. As an example, none, part, or all of the intervening element(s) may be controllable to provide a low-ohmic connection and, at another time, a non-low-ohmic connection between the "electrically coupled" elements. The term "electrically connected" intends to describe a low-ohmic electric connection between the elements electrically connected together, e.g., a connection via a metal and/or highly doped semiconductor.

Some Figures refer to relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. Doping regions of the same relative doping concentration may or may not have the same absolute doping concentration. For example, two different $n^+$-doped regions can have different absolute doping concentrations. The same applies, for example, to an $n^-$-doped and a $p^+$-doped region.

Terms such as "first", "second", and the like, are used to describe various structures, elements, regions, sections, etc. and are not intended to be limiting. Like terms refer to like elements throughout the description.

The terms "having", "containing", "including", "comprising" and the like are open and the terms indicate the presence of stated elements or features, but not preclude additional elements or features. The articles "a", "an" and "the" are intended to include the plural as well as the singular, unless the context clearly indicates otherwise.

FIG. 1A refers to an integrated circuit 900 with a power field effect transistor which is adapted to switch a load to a power supply and to control a load current of several 100 mA to several Amperes. A power supply, for instance a car battery, may be electrically coupled to a drain terminal 331 of the integrated circuit 900. A load, for instance a light bulb, may be electrically coupled to a first source terminal 114 of the integrated circuit 900. A first field effect transistor structure 100 is provided with its drain-source path in a current path between the drain terminal 331 and the first source terminal 114. A first gate signal G1 is supplied to a first gate electrode structure 121 of the first field effect transistor structure 100. An intrinsic gate-to-drain capacity Cgd is effective between the first gate electrode structure 121 and the drain electrode of the first field effect transistor structure 100, wherein a switching time of the first field effect transistor structure 100 increases with increasing Cgd. A first field electrode structure 151 of the first field effect transistor structure 100 may be connected to a source electrode of the first field effect transistor structure 900 to lower the effective Cgd and to increase switching speed.

A second field effect transistor structure 200 is provided with its source-to-drain path between the drain terminal 331 and a second source terminal 214. The second field effect transistor structure 200 includes a second gate electrode structure 221 and a second field electrode structure 251. The second gate electrode structure 221 is electrically separated from the first gate electrode structure 121. With the separation of the first and the second gate electrode structures 121, 221 the first and second field effect transistor structures 100, 200 can be switched independently. The second gate electrode structure 221 may float. According to other embodiments, the second gate electrode structure 221 may be electrically coupled to a fixed potential or to the output of a driver circuit or to other circuit elements within the integrated circuit 900. The second field electrode structure 251 is electrically separated from the first field electrode structure 151. The first and the second field electrode structures 151, 251 are connected differently.

For example, the second field electrode structure 251 may be electrically coupled to the second gate electrode structure 221. Electrically coupling the second field electrode structure 251 and the second gate electrode structure 221 increases the gate-to-drain capacity Cgd of the second field effect transistor 200. As a result fast transient signals (pulses) applied to the drain terminal 331 or to the second source terminal 214 may switch on the second field effect transistor structure 200 by capacitive coupling via the capacitive potential divider Cgd/Cgs. The second field effect transistor structure 200 may be effective as a protection switch by-passing fast transients, for example high-frequent noise and electrostatic discharge (ESD) pulses, which are applied to the drain terminal 331 or to the second source terminal 214, thereby protecting the integrated circuit 900 from destructive currents due to fast transient pulses that may turn on destructive parasitic devices within the integrated circuit 900. The first field effect transistor structure 100 may be configured to be effective as a switching element optimized with regard to the switching characteristics between the drain terminal 331 and the first source terminal 114. According to other embodiments the second field electrode structure 251 may be electrically coupled to a fixed potential or to the output of a driver circuit.

The first field effect transistor structure 100 includes a first source electrode structure 112 and the second field effect transistor structure 200 includes a second source electrode structure 212. The first and second source electrode structures 112, 212 may be electrically coupled to each other. According to an embodiment, the first and the second source electrode structures 112, 212 are electrically separated from each other.

FIG. 1B refers to an integrated circuit 900 based on a semiconductor die 910 having a first surface 911. The semiconductor die 910 is made of a semiconducting material, for example single-crystalline silicon, germanium or gallium arsenide (GaAs). A drift layer 350 of a first conductivity type extends in a vertical direction, which is the direction perpendicular to the first surface 911, into the semiconductor die 910 and forms an interface with a drain zone 330 of the first conductivity type. The drain zone 330 has a higher dopant concentration than the drift layer 350. The interface between the drift layer 350 and the drain zone 330 is in substance parallel to the first surface 911.

In the semiconductor die 910, a first field effect transistor structure 100 is formed in a first active area 161 and a second field effect transistor structure 200 is formed in a second active area 162.

The first field effect structure 100 includes a first channel region 120 and first source regions 110 of the first conductivity type. According to an embodiment referring to enhancement type transistors the first channel region 120 is of a second conductivity type, which is the opposite of the first conductivity type. Both the first channel region 120 and the first source regions 110 are formed in the first active area 161 of the semiconductor die 910. The first source regions 110 may directly adjoin the first surface 911. The first channel region 120 separates the first source regions 110 and a portion of the drift zone 350 formed in the first active area 161. For example, the channel region 120 extends in the vertical direction perpendicular to the first surface 911 between a buried edge of the first source regions 110 and forms an interface with the drift layer 350. The interface may be in substance parallel to the first surface 911. First contact regions 120a of the second conductivity type may be formed in direct contact with both the first source regions 110, the first channel region 120 and the first surface 911 to avoid charge storing effects in the first channel region 120.

The first field effect transistor structure 100 further includes a first drain zone section 132 of the drain zone 330 formed within the first active area 161.

A first source electrode structure 112 is provided in a region in substance corresponding to the first active area 161 and in direct contact to the semiconductor die 910. The first source electrode structure 112 may be a structure of highly doped polycrystalline silicon, a metal or metal compound, for example copper Cu, aluminum Al, tungsten W, or of highly conductive compounds. In accordance with other embodiments the first source electrode structure 112 comprises two or more layers of different materials, for example metal silicides, metal nitrides, diffusion barrier materials and/or pure metals.

The first field effect transistor structure 100 further includes a first gate electrode structure 121 and a first field electrode structure 151 provided in at least one first trench structure 301 extending from the first surface 911 into the semiconductor die 910, wherein a trench bottom of the at least one first trench structure 301 is formed within the drift layer 350 at a distance to the interface between the drift layer 350 and the drain zone 330. The first gate electrode structure 121 may be provided at a first distance to the first surface 911, the first distance corresponding to a second distance between the buried edge of the first source regions 110 and the first surface 911. The first gate electrode structure 121 may extend in a vertical direction up to a third distance to the first surface 911 corresponding in substance to a fourth distance between the first surface 911 and an interface between the first channel region 120 and the drift region 350.

The first field electrode structure 151 includes a section extending between the first gate electrode structure 121 and the trench bottom. According to another embodiment, the first field electrode structure 151 may extend between the first surface 911 and the trench bottom in a central portion of the first trench structure 301 wherein the first gate electrode structure 121 is formed in peripheral portions of the first trench structure 301. A first dielectric 152 electrically separates the first field electrode structure 151 and the drift layer 350. A first gate dielectric 122 separates and electrically insulates the first gate electrode structure 121 and the first channel region 120. A first top dielectric 129 separates and electrically insulates the first source electrode structure 112 and the first gate electrode structure 121. A first intermediate dielectric 159 separates and electrically insulates the first field and gate electrode structures 121, 151. The first gate dielectric 122 is thinner than the first dielectric 152.

The second field effect structure 200 includes a second channel region 220, which may be of the second conductivity type, and second source regions 210 of the first conductivity type. Both the second channel region 220 and the second source regions 210 are formed in the second active area 162 of the semiconductor die 910. The second source regions 210 may directly adjoin the first surface 911. The second channel region 220 separates the second source regions 210 and the portion of the drift zone 350 formed in the second active area 162. For example, the channel region 220 extends in the vertical direction between a buried edge of the second source regions 210 and forms an interface with the drift layer 350. The interface may be in substance parallel to the first surface 911 at least in sections. Second contact regions 220a of the second conductivity type may be formed in direct contact with both the second source regions 210, the second channel region 220 and the first surface 911 to avoid charge storing effects in the second channel region 220. The first conductivity type may be n- or p-type.

The second field effect transistor structure 200 further includes a second drain zone section 232 of the drain zone 330 within the second active area 162.

A second source electrode structure 212 is provided in a region in substance corresponding to the second active areas 162 and in direct contact to the semiconductor die 910. The second source electrode structure 212 may be of the same type and made of the same materials as the first source electrode structure 112.

The second field effect transistor structure 200 further includes a second gate electrode structure 221 and a second field electrode structure 251 provided in at least one second trench structure 302 extending from the first surface 911 into the semiconductor die 910, wherein a trench bottom of the second trench structure 302 is formed within the drift layer 350 in a distance to the interface between the drift layer 350 and the drain zone 330.

The second gate electrode structure 221 may be arranged at a fifth distance to the second surface 911, the fifth distance corresponding to a sixth distance between the buried edge of the second source regions 210 and the first surface 911. The second gate electrode structure 221 may extend in the vertical direction up to a seventh distance to the first surface 911 in substance corresponding to an eighth distance between the first surface 911 and the interface between the second channel region 220 and the drift region 350. The second field electrode structure 251 includes a section in the region between the second gate electrode structure 221 and the trench bottom. According to another embodiment, the second field electrode structure 251 may extend between the first surface 911 and the trench bottom in a central portion of the second trench structure 302 wherein the second gate electrode structure 221 is formed in peripheral portions of the second trench structure 302.

A second dielectric 252 separates the second field electrode structure 251 from the drift layer 350. A second gate dielectric 222 separates and electrically insulates the second gate electrode structure 221 and the second channel region 220. A second top dielectric 229 separates the second source electrode structure 212 and the second gate electrode structure 221. A second intermediate dielectric 259 separates and electrically insulates the second gate and field electrode structures 221, 251. The second gate dielectric 222 is thinner than the first dielectric 252.

The material of the first and second gate electrode structures 121, 221 and the first and second field electrode structures 151, 251 may be highly conductive material, for example a doped semiconductor material, e.g. doped polycrystalline silicon. The material of the first and second dielectrics 152, 252 may be or may contain silicon oxide, silicon nitride, siliconoxynitride or another insulating oxide or nitride. The material of the first and second top dielectrics 129, 229 may be or may contain silicon oxide, silicon nitride, siliconoxynitride and/or another insulating oxide or nitride. The material of the first and second gate dielectrics 122, 222 may be or may contain silicon oxide, silicon nitride, siliconoxynitride and/or another insulating oxide or nitride. The material of the first and second intermediate dielectrics 159, 259 may be or may contain silicon oxide, silicon nitride, siliconoxynitride and/or another insulating oxide or nitride.

The first and the second drain zone sections 132, 232 may form a contiguous drain zone 330. A drain electrode structure 312 may be provided on a second surface 912 of the semiconductor die 910, wherein the second surface 912 is the surface opposite to the first surface 911. The drain electrode structure 312 may form or may be electrically connected to a drain terminal 331. Other embodiments may refer to a "Drain-Up" approach with the drain electrode structure 312 formed on the first surface 911 and highly-doped interconnection structures extending through the semiconductor die 910 between the drain electrode structures 312 and the drain zone 312.

The first source electrode structure 112 may form or may be electrically coupled to a first source terminal 114 of the integrated circuit 900 and the second source electrode structure 212 may form or may be electrically coupled to a second source terminal 214.

The first and the second active areas 161, 162 are separated by boundary construction. These boundary constructions may include or consist of two pn-junctions. For example at the edges of each active area 161, 162, doped columns 351a of the second conductivity type may extend from the first surface 911 in the vertical direction into the semiconductor die 910 at least up to a distance that is greater than the distance between the first surface 911 and the interface the channel regions 120, 220 form with the drift layer 350. A region of the first conductivity type, which may be a section of the drift layer 350, is formed between the columns 351a. A gap 332, which may be filled with an insulating material, separates the first and second source electrode structures 112, 212.

The first and second trench structures 301, 302 may be groove-shaped and may extend in a direction perpendicular to the cross-sectional plane. The first and the second field effect transistor structures 100, 200 may include one single trench structure 301, 302, respectively, or a plurality of trench structures 301, 302. The first and second trench structures 301, 302 may run parallel to each other and may be evenly spaced. According to an embodiment the first and second trench structures 301, 302 have the same size and cross-sectional shape.

When the first field effect transistor structure 100 is in an OFF-state, the channel region 120 separates the first source regions 110 from the drift zone 350 and no current flows between the first source regions 110 and the drift zone 350. When a suitable voltage is applied to the first gate electrode structure 121, in the first channel region 120 minority charge carriers accumulate along the first gate dielectric 122 such that conductive inversion channels are formed between the first source regions 110 and the drift zone 350 along the trench walls through the first channel region 120. A current flows between the first source regions 110 and the drain zone 330. The second field effect transistor structure 200 operates accordingly.

According to an embodiment, in the first field effect transistor structure 100 the first field electrode structure 151 has a potential that is equal to or close to the potential of the source terminal 114. The gate-to-drain capacity Cgd is low and the switching characteristics of the first field effect transistor structure 100 may be optimized with regard to response speed or power dissipation. In the second field effect transistor structure 200 the potential at the second field electrode 251 may be equal to or close to the potential at the second gate electrode structure 221 such that the gate-to-drain capacity Cgd is high and the second field effect transistor structure 200 can be capacitively controlled through a fast transient pulse applied to the drain terminal 331. As a consequence, the separated gate electrode structures 121, 221 and separated field electrode structures 151, 251 allow combining fast or optimized switching of loads with efficient fast transient response. In configurations providing only fast switching power transistor structures a fast transient pulse applied at the drain terminal may result in an erroneous activation or in failing activation of the power transistor structures or in a local damage in the power transistor structure or in further logic circuits of the integrated circuit. By contrast, in configurations like FIG. 1B providing a protection transistor represented by the second field effect transistor structure 200 a fast transient pulse applied to the drain terminal activates the protection transistor which dissipates the energy of the fast transient impulse before any damage or malfunction of the integrated circuit can occur.

FIG. 2A refers to an embodiment with two second active areas 162 arranged on opposing sides of a first active area 161. A first source electrode structure 112 is arranged in a sectional area of a first surface of the semiconductor 910, the sectional area in substance corresponding to the first active area 161. A second electrode structure 162 includes two parts, each part in substance covering a further sectional area of the first surface of the semiconductor 910, each further sectional area in substance corresponding to the second active area 162. A third active area 163 may be defined where further driver circuits and logic circuits are formed within the semiconductor die 910.

According to other embodiments, both the second gate electrode structure 221, and the second field electrode structure 251 may be connected to the same potential. In accordance with further embodiments the second gate and field electrode structures 221, 251 are connected to different, fixed or controllable potentials.

FIG. 2B shows a cross-sectional view along line BB of FIG. 2A in accordance with an embodiment providing two metallization planes. Along the edges of the first and second active areas 161, 162 isolation trenches 351 form an isolation structure electrically separating the first and second active areas 161, 162. An insulating layer 371 may line the isolation trenches 351. The thickness of the insulating layer 371 may correspond to the thickness of the first and second dielectrics 152, 252. In the rest the isolation trenches 351 may be filled with a conductive material, which may be the same material which forms the first and second field electrode structures 151, 251. The size and cross-sectional shape of the isolation trenches 351 may in substance correspond to that of the first and second trench structures 301, 302.

FIG. 2B shows a configuration with no first and second source regions 110, 210 formed between the isolation trench 351 and the first neighboring first and second trench structure 301, 302 of the associated active area 161, 162. First and second source regions 110, 210 are formed contiguously between adjacent first and second trench structures 301, 302 respectively. A patterned metal layer 311 is provided in a distance to the first surface 911. From source lines formed from the patterned metal layer 311 first conductive plugs 311a extend to the first surface 911 and directly contact the first and second source regions 110, 210. Second conductive plugs 111b, 211b electrically connect source lines in the patterned metal layer 311 with first and second channel regions 120, 220. Third conductive plugs 111c, 211c are provided between source lines in the patterned metal layer 311 and a conductive material filling the isolation trenches 351.

A first source electrode structure 112 and a second source electrode structure 212 may be provided in a distance to the patterned metal layer 311. Fourth conductive plugs 112a may electrically connect the first source electrode structure 112 with source lines assigned to the first active area 161. Fifth conductive plugs 212a may electrically connect the second source electrode structure 212 with source lines assigned to the second active area 162. The first and second gate electrode structures 121, 221 may be connected via further conductive plugs in a plane parallel to the cross-sectional plane.

In accordance with another embodiment a third trench structure may be provided between the first and second active areas 161,162. The third trench structure may have the same size and shape as the first trench structure 301 and/or the second trench structure 302. The third trench structure may be completely filled with insulating material. According to an embodiment, the third trench structure includes a third gate electrode structure and/or a third field electrode structure. The third gate electrode may be floating, electrically coupled to a fixed potential, electrically coupled to the first gate electrode structure 121 or to the second gate electrode structure 221. The third field electrode structure may be floating, electrically coupled to a fixed potential, electrically coupled to the first field electrode structure 151, or electrically coupled to the second field electrode structure 251. The third trench structure may enhance the electrical separation between first and second active areas 161, 162.

In accordance with another embodiment a shallow trench isolation structure may be provided for separation of the first and second active areas 161, 162. The shallow trench isolation structure may extend from the first surface 911 in the vertical direction into the semiconductor die 190 at least up to a distance which is greater than the distance between the first surface side 911 and an interface formed between the first and second channel regions 120, 220 on the one hand, and the drift zone 350 on the other hand.

Figure 3:
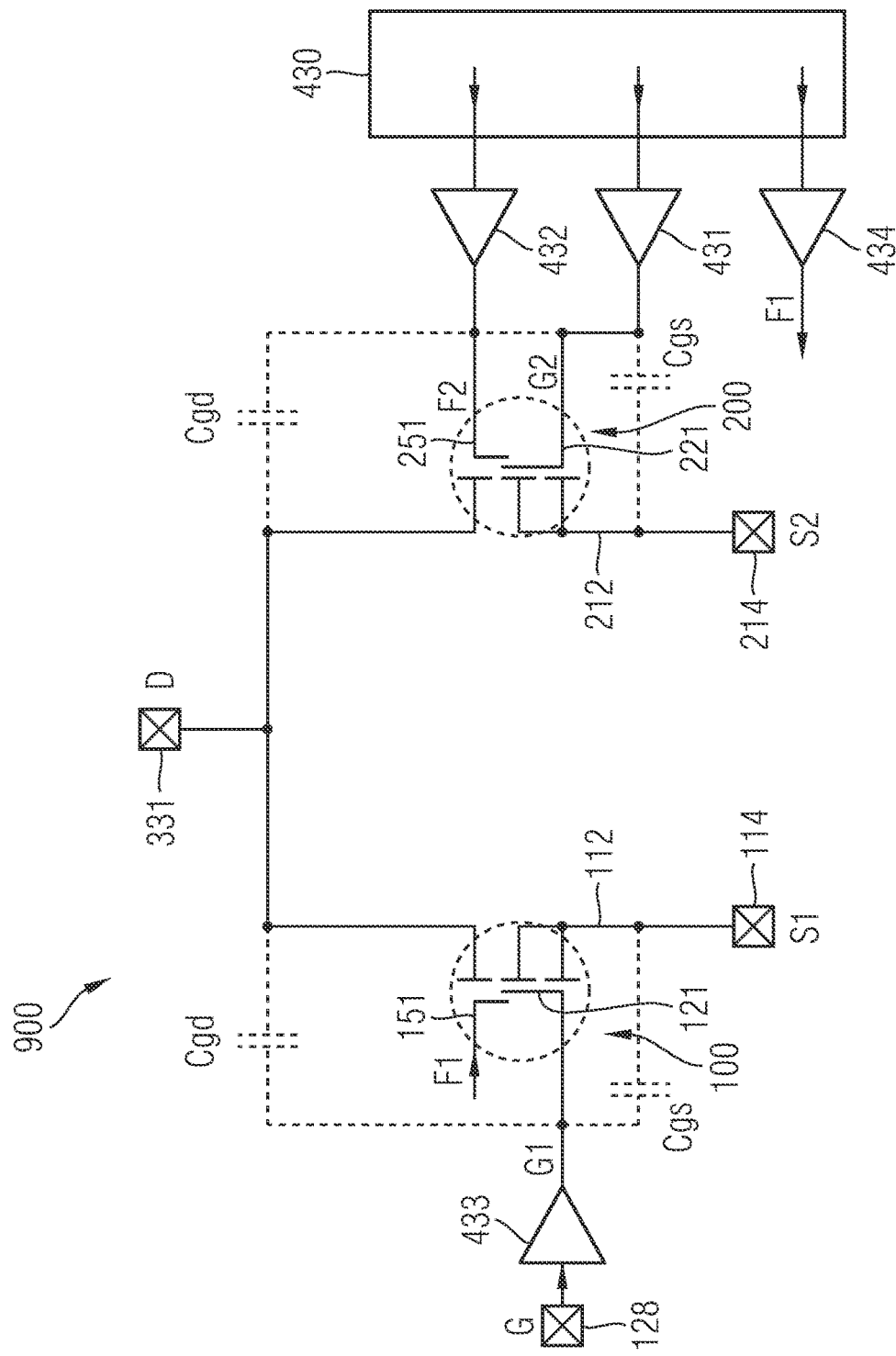
FIG. 3 is a schematic circuit diagram of an integrated circuit with a first and a second field effect transistor structure according to an embodiment with driver circuits for driving signals applied to field and gate electrode structures.

FIG. 3 refers to an embodiment with a first driver circuit 431 controlling the potential at the second gate electrode structure 221. A second driver circuit 432 may control the potential at the second field electrode structure 251. According to another embodiment, a fourth driver circuit 434 may control the potential at the first field electrode structure 151. A logic circuit 430 may provide the input signals to at least one of the first, second and fourth driver circuits 431, 432, 434. According to an embodiment the logic circuit 430 provides fixed potentials during the operation of the integrated circuit 900. In accordance with other embodiments, the logic circuit 430 drives the input signals for the first, second and fourth driver circuits 431, 432, 434 in response to a current operation mode of the integrated circuit 900.

The first gate electrode structure 121 may be electrically connected to a gate terminal 128 of the integrated circuit 900. In accordance with an embodiment, a third driver circuit 433 is provided between the gate terminal 128 and the first gate electrode structure 121.

FIG. 4 refers to an embodiment with a plurality of first trench structures 301 in a first active area 161 and a plurality of second trench structures 302 in a second active area 162. In the first active area 161, a first field effect structure 100 comprises a plurality of sections, wherein each section is assigned to one of the first trench structures 301. The first field electrode structure 151 is electrically coupled to the first source terminal 114.

In the second active area 162, a second field electrode structure 251 includes a plurality of sections, wherein each section is provided in one of the second trench structures 302. The second field electrode structure 251 is electrically coupled to the second gate electrode structure 221. Conductive junctions between the second gate electrode structure 221 and the second field electrode structure 251 may be formed in sections of the groove-like trenches which extend beyond a transistor cell field and the source electrode structure. In accordance with an embodiment, a dielectric isolator is not formed over the second field electrode structure 251 before deposition of the material of the second gate electrode structure 221 or is removed before deposition of the material forming the second gate electrode structure 221. In addition or alternatively, conductive plugs may be provided between the second field electrode structure 251 and the second gate electrode structure 221. According to other embodiments, the material for the first and second field electrode structures 151, 251 is formed in parts above the first surface 911 and contacts to the first and second field electrode structures 151, 251 are provided in regions outside the trenches 301, 302.

FIG. 5 refers to an embodiment of an integrated circuit 900 first field effect transistor structure 100 including two types of first trench structures 301a, 301b, which may be alternatingly arranged. FIG. 5 illustrates a section including the first field effect transistor structure 100. The first field effect transistor structure 100 includes a first type of first trench structures 301a providing a first type of field electrode structures 151b which may be electrically coupled to the first gate electrode structures 121. A second type of first trench structures 301b provides a second type of field electrode structures 151a which may be electrically coupled to a source potential. By providing predetermined numbers of first trench structures 301a, 301b of the first and second type, the switching characteristics of the integrated circuit 900 can be tuned to a variety of applications.

In addition, FIG. 5 shows a collector layer 390 of the second conductivity type. The collector layer 390 is formed directly adjoining the drain zone 330 along the second surface 192 of the semiconductor die 190. The collector layer 390 is electrically coupled to a collector terminal 395 of the integrated circuit 900.

For example, a collector electrode structure 391 may be provided at the second surface 192 of the semiconductor die 190. The collector electrode structure 391 may be of a metal, for example copper or aluminum and/or may include several layers of different highly conductive materials. According to this embodiment, the first field effect transistor structure 100 forms an insulated gate bipolar transistor (IGBT).

With the embodiment of FIG. 5, the first field effect transistor structure 100 forms a power field effect transistor, whose gate-to-drain capacity Cgd is between a theoretical minimum value achieved with all first field electrode structures 151a, 151b electrically coupled to source potential and a theoretical maximum value with all first field electrode structures 151a, 151b electrically coupled to the gate potential. The gate-to-drain capacity value of the power transistor is tunable at manufacturing level. According to other embodiments, the first field electrode structures 151a, 151b may be connected to outputs of controllable driver circuits, such that the overall gate-to-drain capacity of a power field effect transistor structure can be adapted according to the requirements of an application during operation and the same integrated circuit is configurable for a plurality of different applications. In addition, the concept allows adaptation of the gate-to-drain capacity Cgd during operation of an integrated circuit.

According to a method of manufacturing an integrated circuit an overall gate-to-drain capacitance of a power transistor is selected in accordance with application requirements. A number of first field effect transistor structures of a first type having a minimum gate-to-drain capacitance and a number of first field effect transistor structures of a second type having a maximum gate-to-drain capacitance are determined to provide the selected overall gate-to-drain capacitance. On a semiconductor die, first field effect transistor structures of a first type showing the minimum gate-to-drain capacitance and first field effect transistor structures of the second type having the maximum gate-to-drain capacitance are provided according to the determined numbers. Second field effect transistor structures are provided whose gate electrode structures are electrically separated from first gate electrode structures of the first field effect transistor structures.

A method of operating an integrated circuit with first and second field effect transistor structures provides control of the first and second field effect transistor structures by a logic circuit. An operation mode is detected. The potential of the field electrode structures is controlled in accordance with a scheme assigning field electrode potentials to operation modes. Gate electrode structures of the first and second field effect transistor structures are electrically separated. The first field effect transistor structures may include trench structures providing differently connected types of the first field electrode structures.

FIG. 6 illustrates a further method of manufacturing an integrated circuit includes forming a first field effect transistor structure comprising a first gate electrode structure and a first field electrode structure (702). A second field effect transistor structure comprising a second gate electrode structure and a second field electrode structure is formed, wherein the first and second gate electrode structures are formed to be electrically separated from each other, and the first and the second field electrode structures are formed to be electrically separated from each other (704). According to an embodiment the first field effect transistor structure is formed in a first active area and the second field effect transistor structure is formed in a second active area of the integrated circuit. An isolation structure is provided between the first and second active areas.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing an integrated circuit, the method comprising:
    forming, in a semiconductor die, at least one of a logic circuit and a driver circuit;
    forming, in the semiconductor die, a first field effect transistor structure comprising a first gate electrode structure, a first field electrode structure, a first channel region of a second conductivity type, and a first drain zone section of a first conductivity type opposite the second conductivity type, and
    forming, in the semiconductor die, a second field effect transistor structure comprising a second gate electrode structure, a second field electrode structure, a second channel region of the second conductivity type, and a second drain zone section of the first conductivity type, wherein
    the first gate electrode structure and the second gate electrode structure are formed to be electrically separated from each other,
    the first field electrode structure and the second field electrode structure are formed to be electrically separated from each other,
    the first drain zone section and the second drain zone section form a contiguous drain zone of the first conductivity type in the semiconductor die,
    the second field electrode structure is electrically connected to the second gate electrode structure, to increase a gate-to-drain capacitance of the second field effect transistor structure,
    the first field electrode structure is electrically coupled to a source electrode of the first field effect transistor structure, to lower a gate-to-drain capacitance of the first field effect transistor structure,
    the first field effect transistor structure is a power switch configured to switch a load to a power supply and control a load current, and
    the second field effect transistor structure is a protection switch configured to respond to fast transient impulses and thereby protect the integrated circuit from destructive currents.

2. The method of claim 1, wherein
    the first field effect transistor structure is formed in a first active area of the integrated circuit, and
    the second field effect transistor structure is formed in a second active area of the integrated circuit, and further comprising
    providing an isolation structure between the first active area and the second active area.

3. The method of claim 1, wherein
    the second field effect transistor structure comprises a source electrode, and
    the source electrode of the first field effect transistor structure and the source electrode of the second field effect transistor structure are electrically separated from each other.

4. The method of claim 1, further comprising:
    electrically coupling the source electrode of the first field effect transistor structure to a first source terminal of the integrated circuit.

5. The method of claim 4, further comprising:
    electrically coupling a source electrode of the second field effect transistor structure to a second source terminal of the integrated circuit.

6. The method of claim 1, wherein
    forming the first field effect transistor structure comprises forming the first field effect transistor structure in a first active area of the integrated circuit, and
    forming the second field effect transistor structure comprises forming the second field effect transistor structure in a second active area of the integrated circuit, and
    the method further comprises electrically separating the first active area and the second active area by two pn-junctions.

7. The method of claim 1, further comprising:
    electrically coupling the contiguous drain zone to a drain terminal of the integrated circuit.

8. The method of claim 1, further comprising:
    electrically coupling a first driver circuit to the second gate electrode structure, the first driver circuit configured to control a potential at the second gate electrode structure.

9. The method of claim 1, further comprising:
    electrically coupling a second driver circuit to the second field electrode structure, the second driver circuit configured to control a potential at the second field electrode structure.

10. The method of claim 1, further comprising:
    electrically coupling a first driver circuit to the second gate electrode structure, the first driver circuit configured to control a potential at the second gate electrode structure;
    electrically coupling a second driver circuit to the second field electrode structure, the second driver circuit configured to control a potential at the second field electrode structure; and
    providing a logic circuit configured to control the first driver circuit and the second driver circuit.

11. The method of claim 1, further comprising:
    electrically coupling a third driver circuit to the first gate electrode structure.

12. The method of claim 1, wherein
    forming the first field effect transistor structure comprises forming first source regions adjoining to a first surface of the semiconductor die, the first drain zone section being formed within the semiconductor die at a distance to the first source regions and in a vertical projection of the first source regions, and
    forming the second field effect transistor structure comprises forming second source regions adjoining to the first surface of the semiconductor die, the second drain zone section being formed within the semiconductor die at a distance to the second source regions and in a vertical projection of the second source regions.

13. The method of claim 12, wherein forming the first drain zone section and the second drain zone section comprises:
- forming the first drain zone section and the second drain zone section at a second surface of the semiconductor die; and
- electrically coupling the first drain zone section and the second drain zone section to a drain terminal of the integrated circuit.

14. The method of claim 12, further comprising:
- forming a collector layer directly adjoining to the first drain zone section and the second drain zone section at a second surface of the semiconductor die; and
- electrically coupling the collector layer to a collector terminal of the integrated circuit.

15. The method of claim 1, wherein
- forming the first gate electrode structure and the first field electrode structure comprises forming the first gate electrode structure and the first field electrode structure in at least one first trench structure extending from a first surface into the semiconductor die, and
- forming the second gate electrode structure and the second field electrode structure comprises forming the second gate electrode structure and the second field electrode structure in at least one second trench structure extending from the first surface into the semiconductor die.

16. The method of claim 15, wherein in each of the at least one first trench structure and the at least one second trench structure, a respective gate electrode structure is formed in a first trench portion oriented to the first surface and at least a part of a respective field electrode structure is formed in a second trench portion oriented to a bottom of a respective trench structure.

17. The method of claim 15, wherein the at least one first trench structure and the at least one second trench structure have a same shape and a same size.

18. An integrated circuit, comprising:
- at least one of a logic circuit and a driver circuit formed in a semiconductor die;
- a first field effect transistor structure formed in the semiconductor die, the first field effect transistor structure comprising a first gate electrode structure, a first field electrode structure, a first channel region of a second conductivity type, and a first drain zone section of a first conductivity type opposite the second conductivity type; and
- a second field effect transistor structure formed in the semiconductor die, the second field effect transistor structure comprising a second gate electrode structure, a second field electrode structure, a second channel region of the second conductivity type, and a second drain zone section of the first conductivity type,
- wherein the first gate electrode structure and the second gate electrode structure are electrically separated from each other,
- wherein the first field electrode structure and the second field electrode structure are electrically separated from each other,
- wherein the first and second drain zone sections the first drain zone section and the second drain zone section form a contiguous drain zone of the first conductivity type in the semiconductor die,
- wherein the second field electrode structure is electrically connected to the second gate electrode structure, to increase a gate-to-drain capacitance of the second field effect transistor structure,
- wherein the first field electrode structure is electrically coupled to a source electrode of the first field effect transistor structure, to lower a gate-to-drain capacitance of the first field effect transistor structure,
- wherein the first field effect transistor structure is a power switch configured to switch a load to a power supply and control a load current,
- wherein the second field effect transistor structure is a protection switch configured to respond to fast transient impulses and thereby protect the integrated circuit from destructive currents.

19. The integrated circuit of claim 18, further comprising:
- a first source terminal; and
- a second source terminal,
- wherein the source electrode of the first field effect transistor structure is electrically coupled to the first source terminal,
- wherein the source electrode of the second field effect transistor structure is electrically coupled to the second source terminal.

* * * * *

UNITED STATES PATENT AND TRADEMARK OFFICE
CERTIFICATE OF CORRECTION

PATENT NO. : 10,522,675 B2
APPLICATION NO. : 13/358272
DATED : December 31, 2019
INVENTOR(S) : C. Kadow Page 1 of 1

It is certified that error appears in the above-identified patent and that said Letters Patent is hereby corrected as shown below:

In the Claims

Column 14, Line 16 Claim 18 please change "wherein the first and second drain zone sections the first" to -- wherein the first --

Signed and Sealed this
Seventeenth Day of March, 2020

Andrei Iancu
*Director of the United States Patent and Trademark Office*